(12) United States Patent
Yang et al.

(10) Patent No.: US 9,793,143 B2
(45) Date of Patent: Oct. 17, 2017

(54) SEMICONDUCTOR PROCESSING APPARATUS AND METHOD OF OPERATING THE SAME

(71) Applicant: Taiwan Semiconductor Manufacturing Co., Ltd, Hsin-Chu (TW)

(72) Inventors: Ching-Hai Yang, Taipei (TW); Yao-Hwan Kao, Baoshan Shiang (TW); Shang-Sheng Li, Zhubei (TW); Yung-Chang Lu, New Taipei (TW); Jian-Yuan Lai, Toufen Township, Miaoli County (TW); Kai-Yuan Cheng, Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 416 days.

(21) Appl. No.: 14/147,741

(22) Filed: Jan. 6, 2014

(65) Prior Publication Data

US 2015/0194325 A1  Jul. 9, 2015

(51) Int. Cl.
*H01L 21/67* (2006.01)
*B08B 5/02* (2006.01)

(52) U.S. Cl.
CPC .. *H01L 21/67109* (2013.01); *H01L 21/67028* (2013.01); *B08B 5/02* (2013.01)

(58) Field of Classification Search
CPC ................ B08B 5/02; H01L 21/67017; H01L 21/67012; H01L 21/67028; H01L 21/67034

See application file for complete search history.

(56) References Cited

U.S. PATENT DOCUMENTS

| | | | | |
|---|---|---|---|---|
| 5,810,942 | A * | 9/1998 | Narayanswami | B08B 15/023 134/104.3 |
| 5,826,129 | A * | 10/1998 | Hasebe | H01L 21/67173 396/611 |
| 6,190,458 | B1 * | 2/2001 | Harada | H01L 21/67115 118/52 |
| 2003/0180127 | A1 * | 9/2003 | Kuroda | H01L 21/681 414/217 |

(Continued)

FOREIGN PATENT DOCUMENTS

JP   10294261 A  *  11/1998

OTHER PUBLICATIONS

Machine Translation of Akune, JP 10294261 A, Nov. 1998.*

Primary Examiner — David Cormier
(74) Attorney, Agent, or Firm — McClure, Qualey & Rodack, LLP

(57) ABSTRACT

Embodiments of a semiconductor processing apparatus are provided. The semiconductor processing apparatus includes a housing and a support base disposed in the housing. The semiconductor processing apparatus also includes a carrying arm movably disposed on the support base and a nozzle device disposed on the carrying arm. The semiconductor processing apparatus further includes a wafer plate disposed on the support base. When a cleaning process is performed, the carrying arm is moved toward the wafer plate, and the nozzle device emits a first gas toward the support base and the wafer plate.

19 Claims, 12 Drawing Sheets

(56) References Cited

U.S. PATENT DOCUMENTS

| | | | |
|---|---|---|---|
| 2006/0169207 A1* | 8/2006 | Kobayashi | C23C 16/4401 118/715 |
| 2007/0131256 A1* | 6/2007 | Nanba | B08B 3/02 134/33 |
| 2013/0052591 A1 | 2/2013 | Yang et al. | |

* cited by examiner

SEMICONDUCTOR PROCESSING APPARATUS AND METHOD OF OPERATING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Lithography processes are widely used to form photoresist layers on semiconductor wafers. Lithography processes include hot baking processes to solidify the photoresist layers. In the hot baking processes, a wafer with a photoresist layer is disposed on a hot plate and heated by the hot plate.

However, during the hot baking processes, some particles are formed by the photoresist and deposited on the hot plate. When a subsequent wafer is placed on the hot plate, the particles deposited on the hot plate may be raised and then fall on the wafer, and therefore the wafer becomes contaminated by the particles. Therefore, there are challenges to minimizing particulate contamination of the wafers during processing.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. It is understood that additional operations can be provided before, during, and after the method, and some of the operations described can be replaced or eliminated for other embodiments of the method.

Embodiments of a semiconductor processing apparatus are provided. In some embodiments, the cleaning process (or maintenance process) is performed automatically by the semiconductor processing apparatus. The cleaning time (or maintenance time) of the semiconductor processing apparatus is reduced. Therefore, the cleaning process can be performed more frequently, and particulate contamination of the wafers during processing is minimized.

Figure 1A:
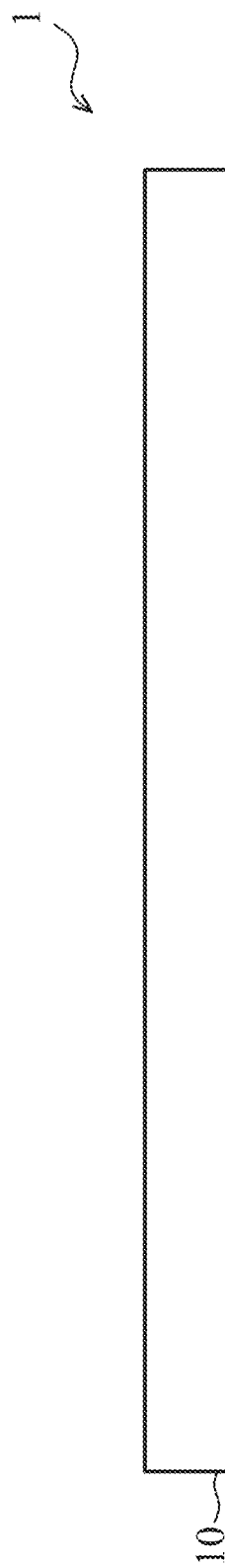
FIGS. 1A and 1B are schematic views of a semiconductor processing apparatus in accordance with some embodiments of the disclosure during a cleaning process.
Figure 1B:
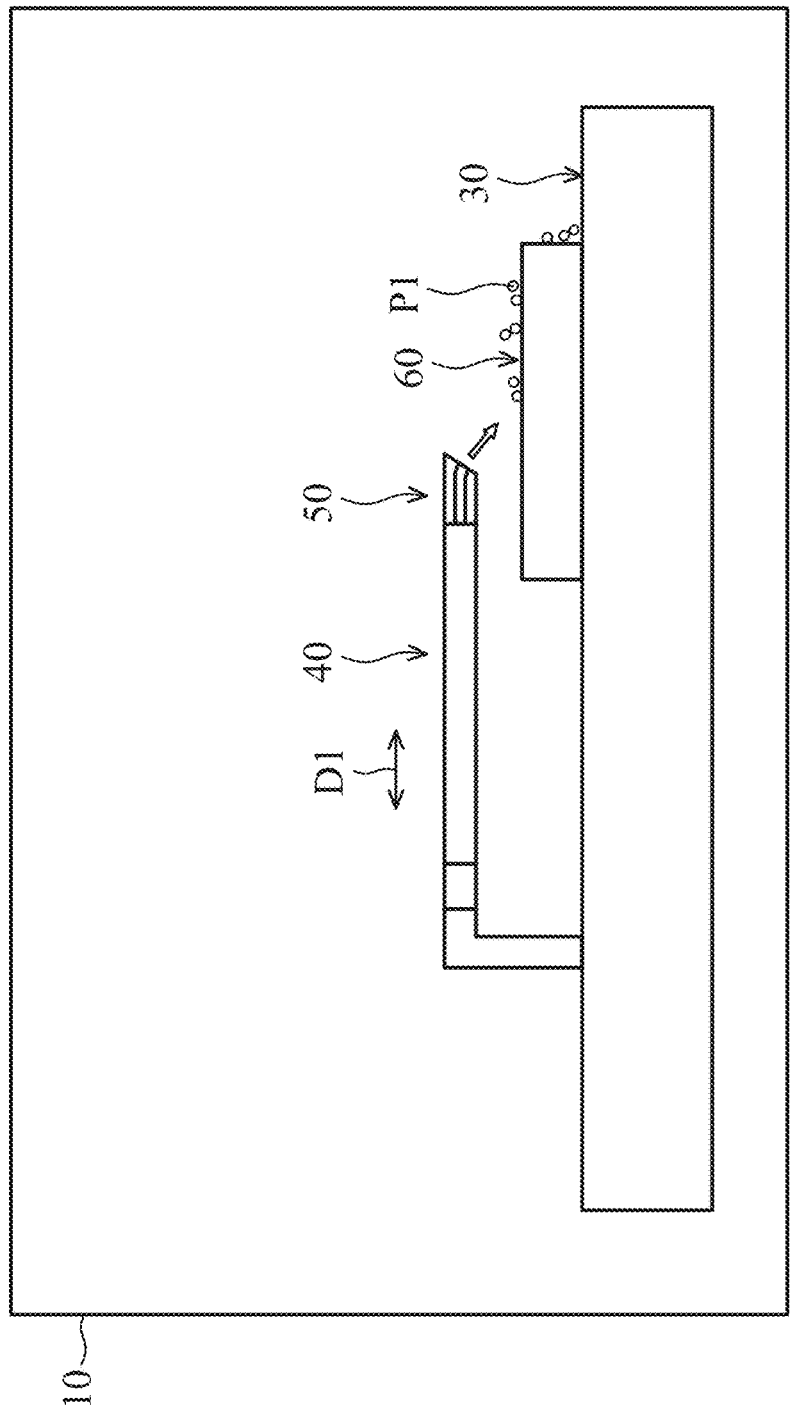

Some embodiments of the disclosure will be described with reference to FIGS. 1A and 1B. FIGS. 1A and 1B are schematic views of a semiconductor processing apparatus 1 in accordance with some embodiments of the disclosure during a cleaning process. In some embodiments, the semiconductor processing apparatus 1 is a baking apparatus or a physical vapor deposition (PVD) apparatus.

As shown in FIGS. 1A and 1B, the semiconductor processing apparatus 1 includes a housing 10, a support base 30, a moving device 40, a nozzle device 50, and a wafer plate 60. The support base 30 is disposed in the housing 10. The moving device 40 is disposed on the support base 30. The moving device 40 is movable relative to the support base 30 along a moving direction D1.

The nozzle device 50 is disposed on the moving device 40. The nozzle device 50 is configured to emit gas toward the support base 30 and the wafer plate 60. The wafer plate 60 is disposed on the support base 30.

In general, some particles P1 are deposited on the wafer plate 60 after a semiconductor process. In some embodiments, the semiconductor process is a baking process or a PVD process. As showing FIGS. 1A and 1B, during the cleaning process, the nozzle device 50 emits gas, and the moving device 40 is moved along the moving direction D1. During the cleaning process, the nozzle device 50 is moved by the moving device 40 from a location over a side of the wafer plate 60 to a location over an opposite side of the wafer plate 60. Therefore, the particles P1 on the wafer plate 60 are removed from the wafer plate 60 by the flowing or sweeping gas.

Figure 2:
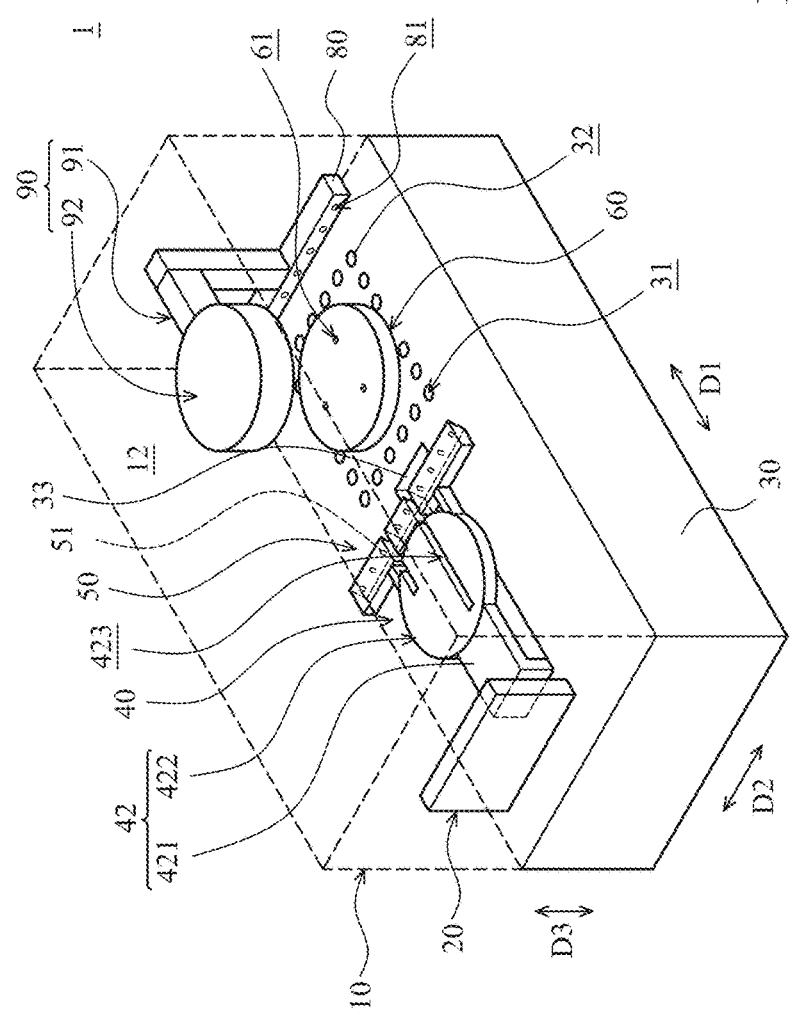
FIG. 2 is a perspective view of a semiconductor processing apparatus in accordance with some embodiments of the disclosure.
Figure 3:
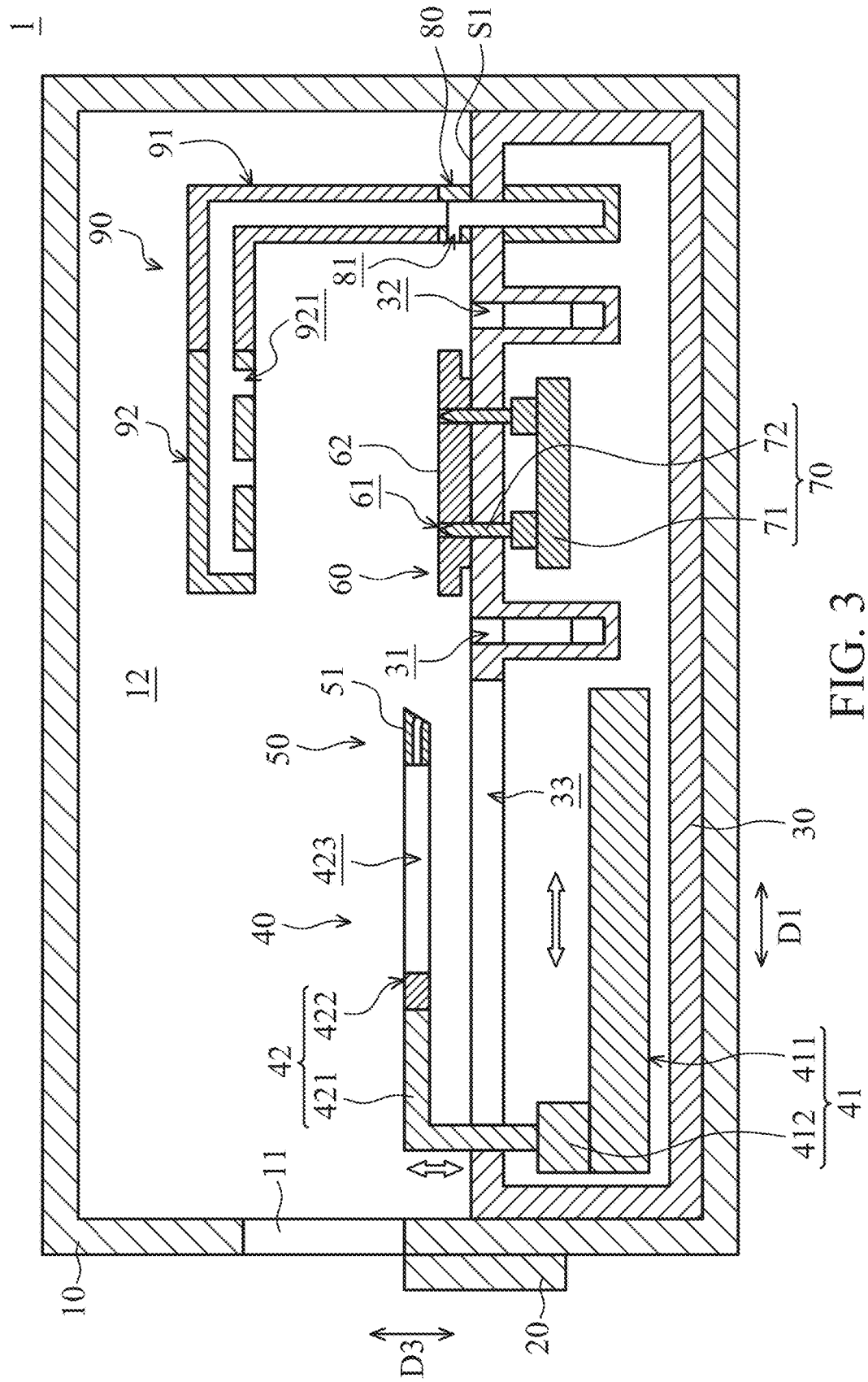
FIG. 3 is a cross-sectional view of the semiconductor processing apparatus in accordance with some embodiments of the disclosure.
Figure 4:
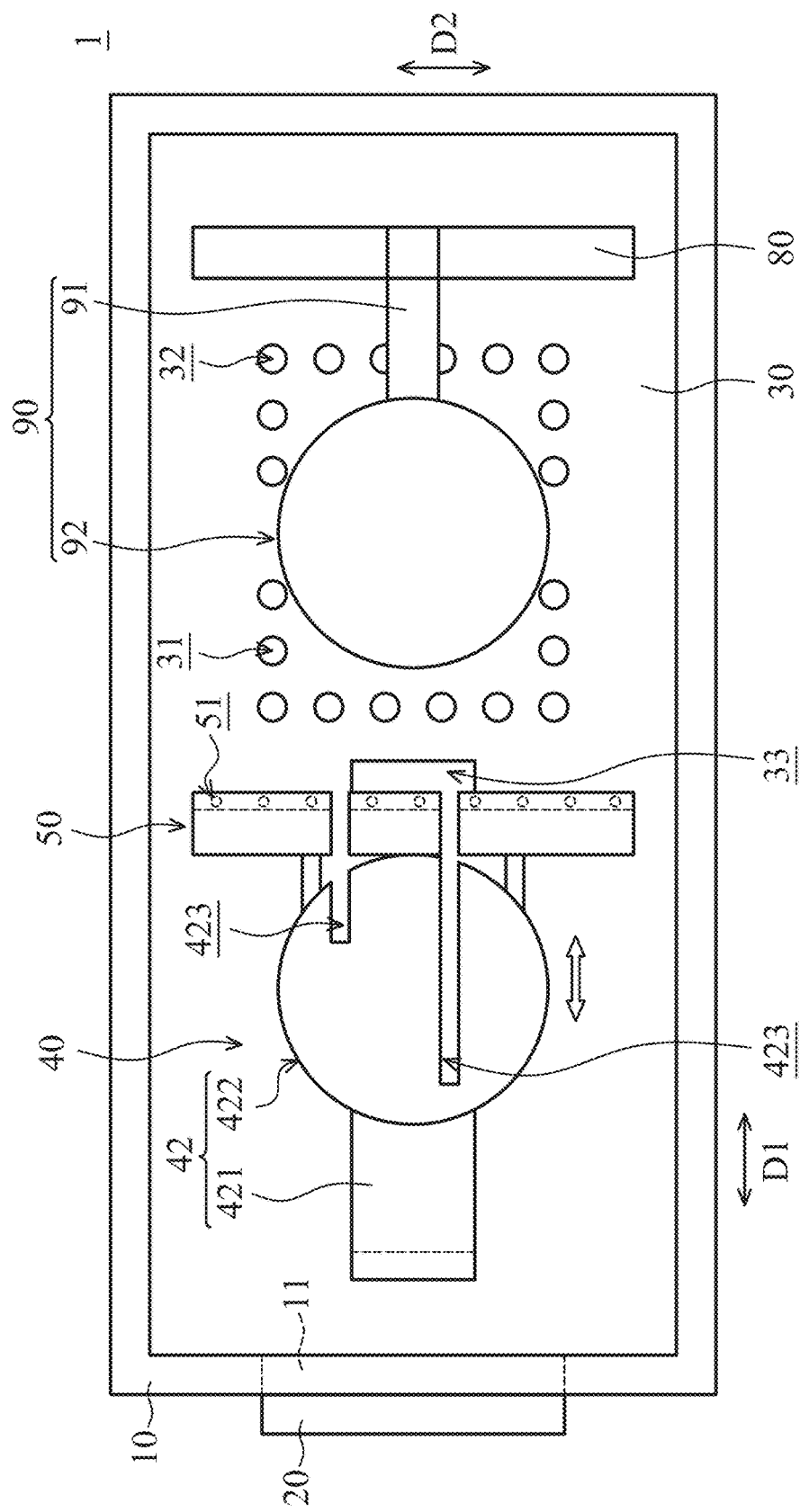
FIG. 4 is a top view of the semiconductor processing apparatus in accordance with some embodiments of the disclosure.

Some embodiments of the disclosure will be described with reference to FIG. 2 to FIG. 4. FIG. 2 is a perspective view of a semiconductor processing apparatus 1 in accordance with some embodiments of the disclosure. FIG. 3 is a cross-sectional view of the semiconductor processing apparatus 1 in accordance with some embodiments of the disclosure. FIG. 4 is a top view of the semiconductor processing apparatus 1 in accordance with some embodiments of the disclosure. In some embodiments, the semiconductor processing apparatus 1 is a baking apparatus. The semiconductor processing apparatus 1 includes a housing 10, a shutter 20, a support base 30, a moving device 40, a nozzle device 50, a wafer plate 60, an elevating device 70, an air-exhaust device 80, and a heating device 90.

The housing 10 has a door opening 11 and a chamber 12. The door opening 11 is in communication with the chamber 12. The shutter 20 is attached to the housing 10 and movable, such as for example, by sliding, pivoting, rotating or shifting, between an open position to open the door opening 11 and a closed position to close the door opening 11. In the closed position, the shutter 20 fully covers the door opening 11 in accordance with some embodiments of the disclosure.

The support base 30 is disposed in the chamber 12. The support base 30 has an upper surface S1, inlets 31, outlets 32, and a guiding opening 33. The inlets 31, the outlets 32, and the guiding opening 33 are located or formed on the upper surface S1. The inlets 31 and the outlets 32 are around the wafer plate 60. The inlets 31 are opposite to the outlet 32 relative to the wafer plate 60. A part of the inlets 31 are located between the carrying arm 42 and the wafer plate 60. In some embodiments, the inlets 31 are arranged in a U-shape configuration. The outlets 32 are arranged in a U-shape configuration.

In some embodiments, each of the inlets 31 has a diameter in a range from about 5 mm to about 20 mm. For example, the diameter of each of the inlets 31 is in a range from about 8 mm to about 12 mm. Each of the outlets 32 has a diameter in a range from about 5 mm to about 20 mm. For example, the diameter of each of the outlets 32 is in a range from about 8 mm to about 12 mm. In some embodiments, the diameter of each of the inlets 31 is substantially equal to the diameter of each of the outlets 32.

The moving device 40 is installed on the support base 30. The moving device 40 includes a moving mechanism 41 and a carrying arm 42. The moving mechanism 41 is disposed in the support base 30. The carrying arm 42 is movably disposed on the moving mechanism 41 and the support base 30. The carrying arm 42 is moved along a moving direction D1 by the moving mechanism 41.

In some embodiments, the moving mechanism 41 includes a track 411 and an elevating element 412. The track 411 is extended along the moving direction D1. The elevating element 412 is movably disposed on the track 411, and moves along the track 411. The carrying arm 42 is disposed on the elevating element 412. The carrying arm 42 is moved up or down by the elevating element 412 along an elevating direction D3. In some embodiments, the elevating direction D3 is perpendicular to the moving direction D1 and the extension direction D2.

Figure 8A:
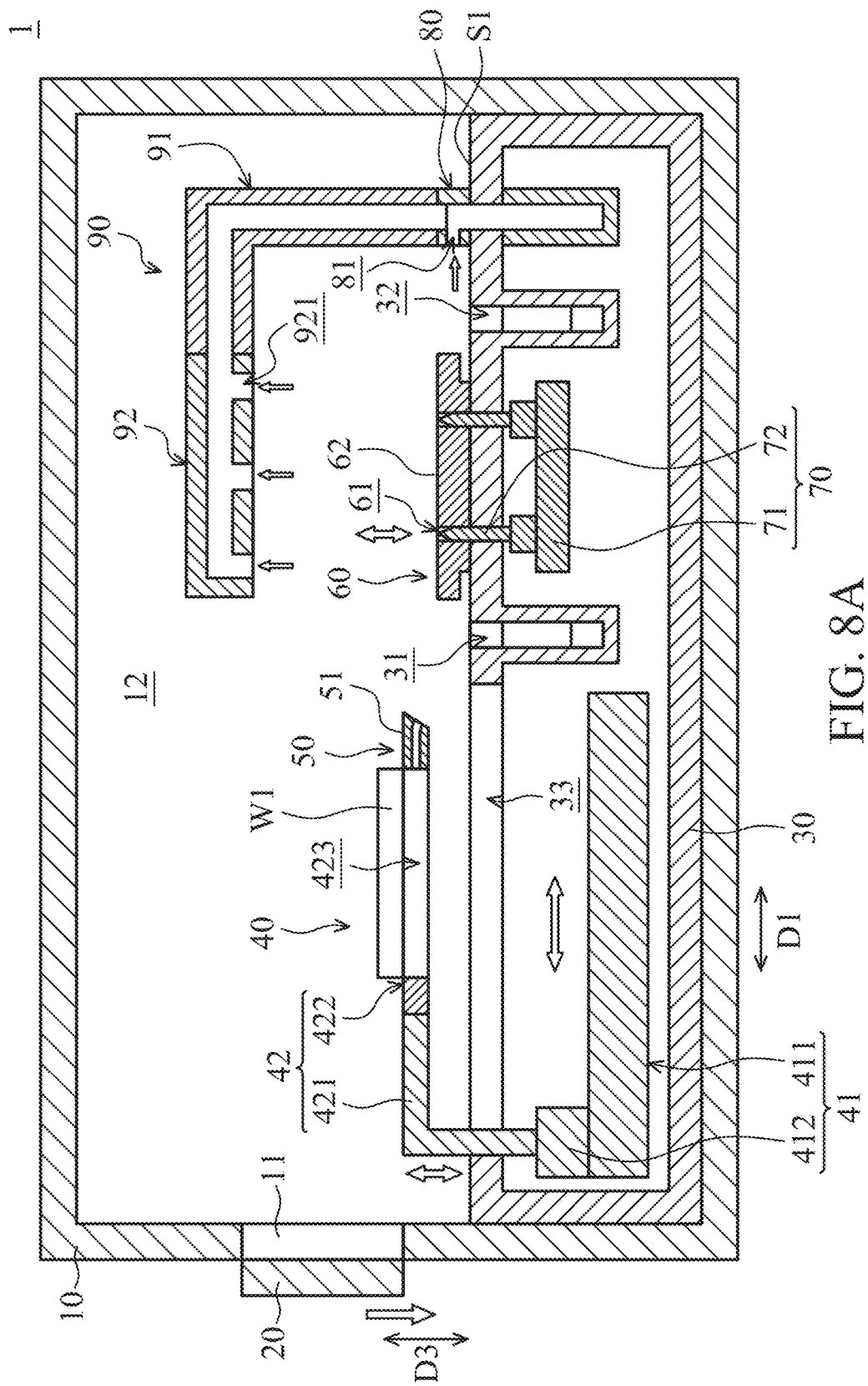
FIGS. 8A and 8B are cross-sectional views of the semiconductor processing apparatus in accordance with some embodiments of the disclosure during various stages of processing a semiconductor substrate.
Figure 8B:
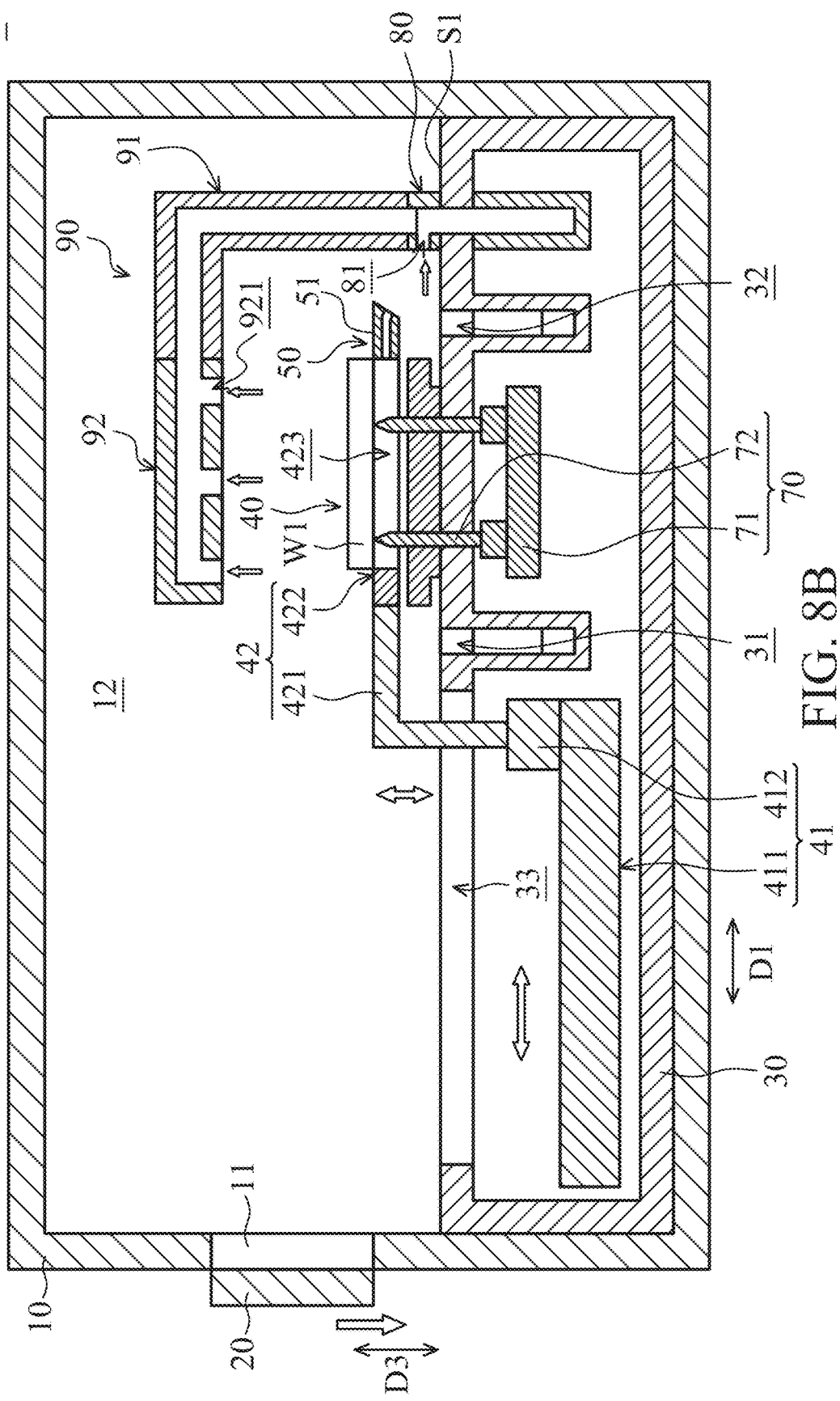

In some embodiments, the carrying arm 42 is a cooling arm. The carrying arm 42 includes a connecting stand 421 and a carrying plate 422. In an embodiment, the connecting stand 421 is an L-shaped structure. The connecting stand 421 is disposed on the elevating element 412, connected to the carrying plate 422, and passes through the guiding opening 33. The carrying plate 422 is connected to the connecting stand 421. In some embodiments, the carrying plate 422 is a cooling plate. Further, the carrying plate 422 includes slots 423. The carrying plate 422 is configured for supporting or retaining a wafer W1 (as shown in FIGS. 8A and 8B). In some embodiments, the size of the carrying plate 422 corresponds to the size of the wafer W1. In some embodiments, the carrying plate 422 is parallel to a horizontal plane and/or the upper surface S1.

The nozzle device 50 is disposed on the carrying plate 422 of the carrying arm 42. In some embodiments, the nozzle device 50 is extended along an extension direction D2. The extension direction D2 is perpendicular to the moving direction D1. In some embodiments, the length of the nozzle device 50 is substantially equal to the width of the support base 30.

The nozzle device 50 includes nozzle holes 51. The nozzle holes 51 are arranged along the extension direction D2. In some embodiments, each of the nozzle holes 51 has a diameter in a range from about 3 mm to about 10 mm. For example, the diameter of each of the nozzle holes 51 is in a range from about 4 mm to about 7 mm.

The wafer plate 60 is disposed on the upper surface S1 of the support base 30. The wafer plate 60 is configured for supporting or retaining a wafer W1. In some embodiments, the wafer plate 60 is parallel to a horizontal plane and/or the upper surface S1. In some embodiments, the wafer plate 60 is a hot plate. The hot plate is configured for heating the wafer W1. Further, the wafer plate 60 includes through holes 61.

The elevating device 70 is installed on the support base 30. The elevating device 70 is located under the wafer plate 60. The elevating device 70 includes an elevating mechanism 71 and pins 72. The elevating mechanism 71 is disposed in the support base 30. The pins 72 are disposed on the elevating mechanism 71, and pass through the through holes 61. The pins 72 are moved along the elevating direction D3 by the elevating mechanism 71. Namely, the pins 72 can be selectively extended above or lower an upper surface 62 of the wafer plate 60.

The air-exhaust device 80 is disposed on the upper surface S1 of the support base 30. The air-exhaust device 80 is opposite to the carrying arm 42 relative to the wafer plate 60. The air-exhaust device 80 is extended along the extension direction D2. In some embodiments, the width of the air-exhaust device 80 is substantially equal to the width of the support base 30.

The air-exhaust device 80 includes exhaust holes 81. The exhaust holes 81 are arranged along the extension direction D2. In some embodiments, each of the exhaust holes 81 has a diameter in a range from about 3 mm to about 10 mm. For example, the diameter of the exhaust holes 81 is in a range from about 4 mm to about 7 mm.

The heating device 90 is disposed on the air-exhaust device 80 or the upper surface S1 of the support base 30. The heating device 90 includes a rack 91 and a thermal plate 92. In some embodiments, the rack 91 is disposed on the air-exhaust device 80, and connected to the thermal plate 92. The thermal plate 92 is parallel to a horizontal plane and/or the upper surface S1. The thermal plate 92 is located over the wafer plate 60. In some embodiments, the heating device 90 is not formed or provided in the semiconductor processing apparatus 1.

The thermal plate 92 includes exhaust holes 921. The exhaust holes 921 are arranged in an array on the thermal plate 92. In some embodiments, each of the exhaust holes 921 has a diameter in a range from about 1 mm to about 5 mm.

Figure 5:
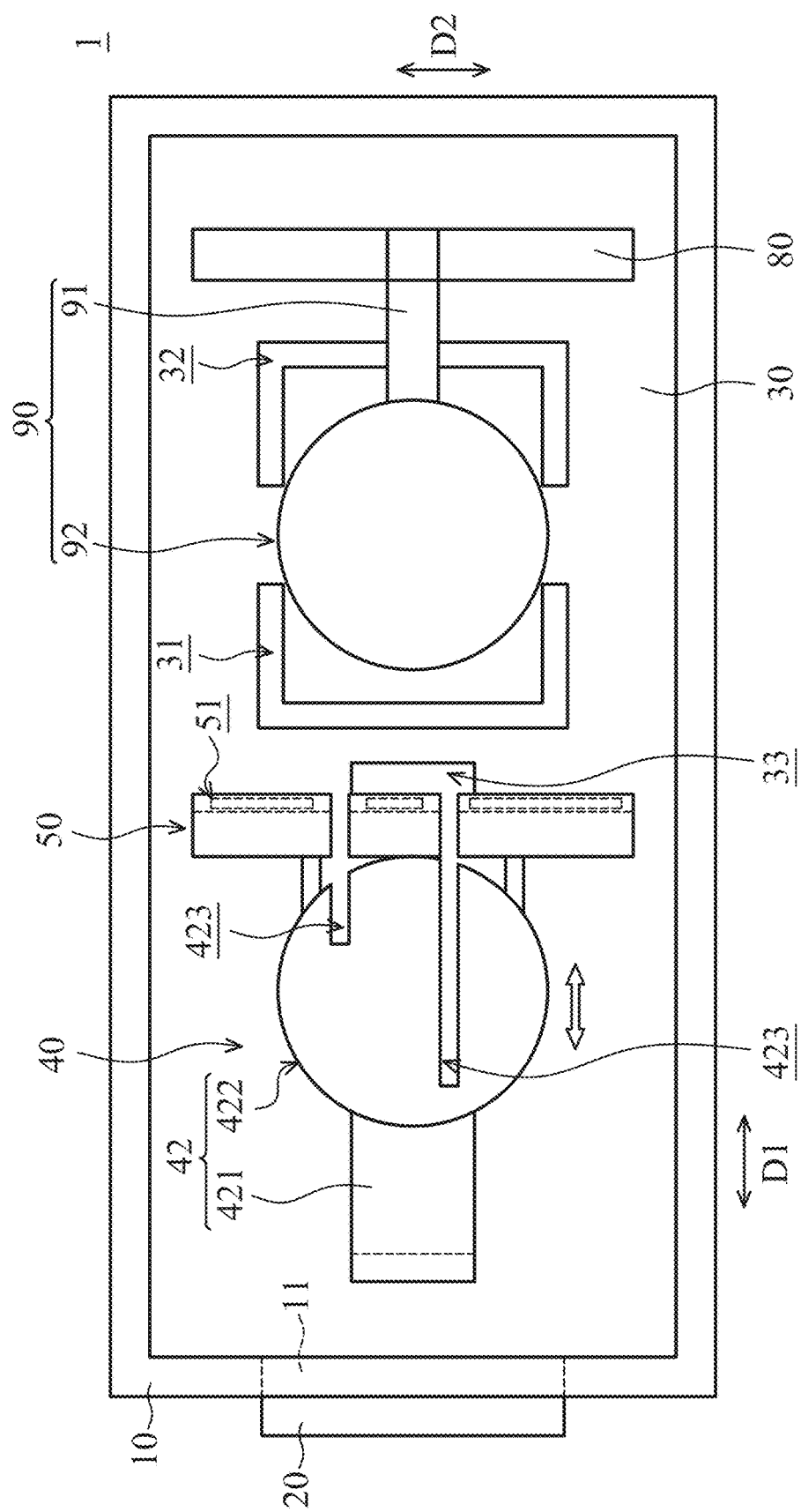
FIG. 5 is a top view of the semiconductor processing apparatus in accordance with some embodiments of the disclosure.

FIG. 5 is a top view of the semiconductor processing apparatus 1 in accordance with some embodiments of the disclosure. In some embodiments, as shown in FIG. 5, the support base 30 has an outlet 32 and an inlet 31. The outlet 32 is a U-shape structure. The inlet 31 is a U-shape structure. The nozzle device 50 has a nozzle hole 51. The nozzle hole 51 is a linear structure extended along the extension direction D2.

In some embodiments, the outlet 32 is a linear structure extended along the extension direction D2. The inlet 31 is a linear structure extended along the extension direction D2.

Figure 6:
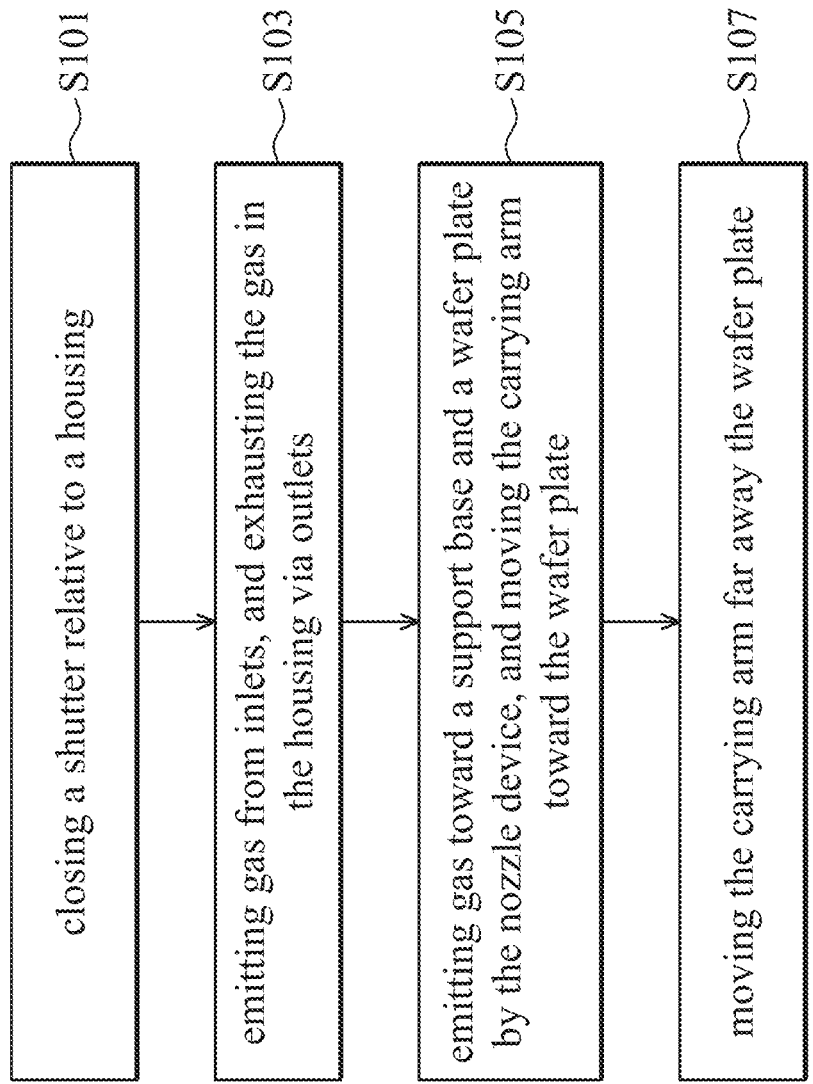
FIG. 6 is a flow chart of an operation method of cleaning a semiconductor processing apparatus in accordance with some embodiments of the disclosure.
Figure 7A:
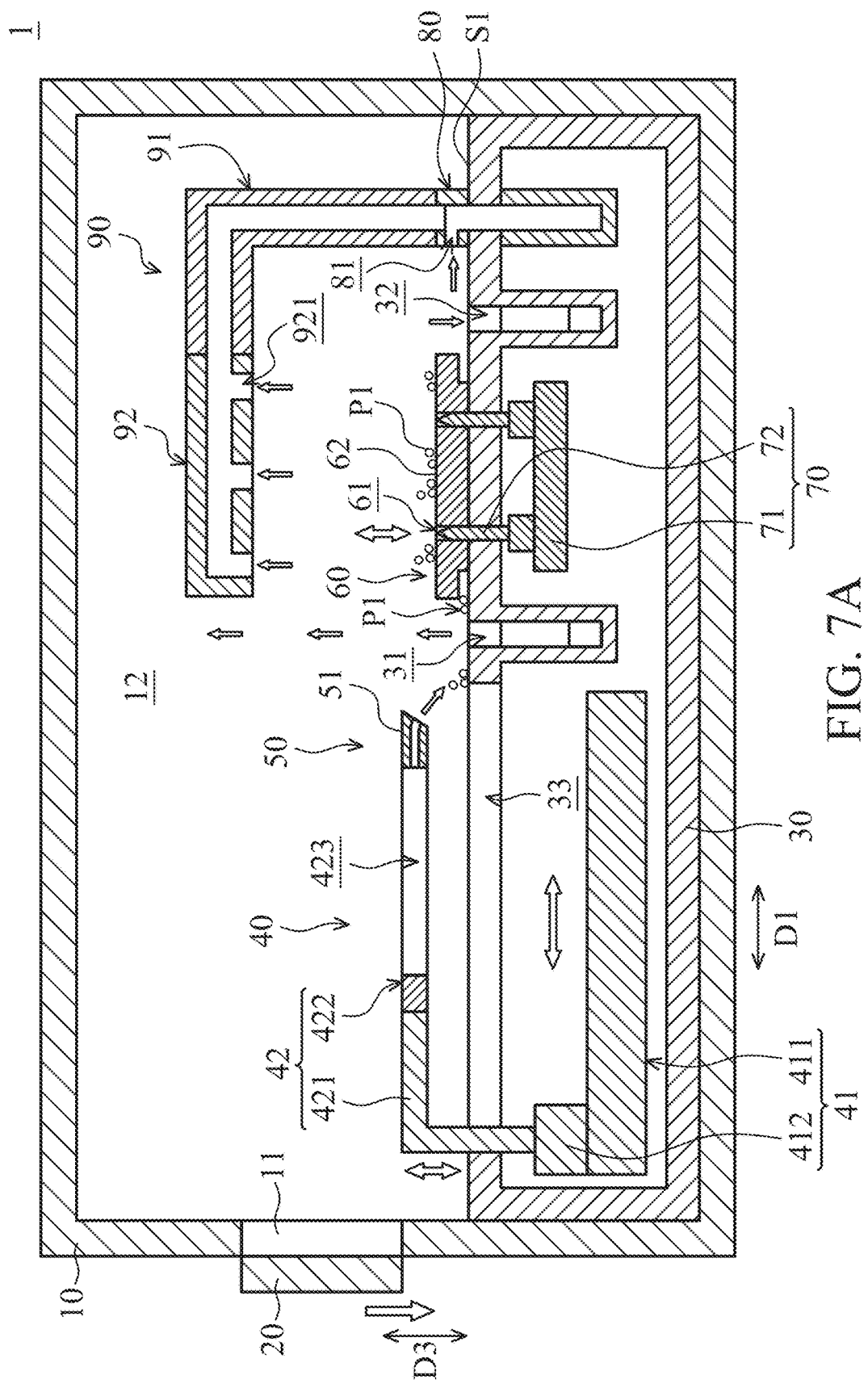
FIGS. 7A, 7B and 7C are cross-sectional views of the semiconductor processing apparatus in accordance with some embodiments of the disclosure during a cleaning process.
Figure 7B:
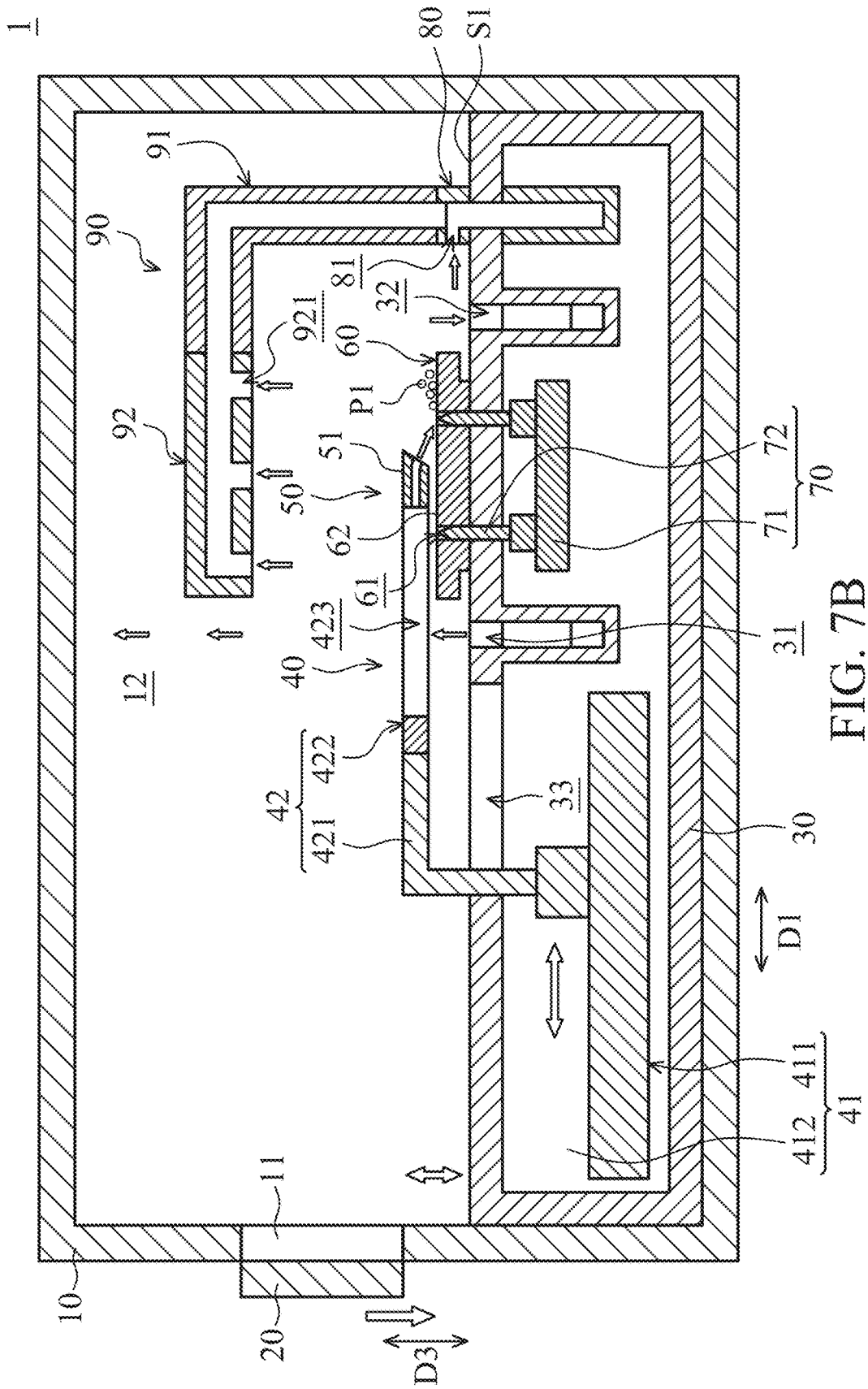
Figure 7C:
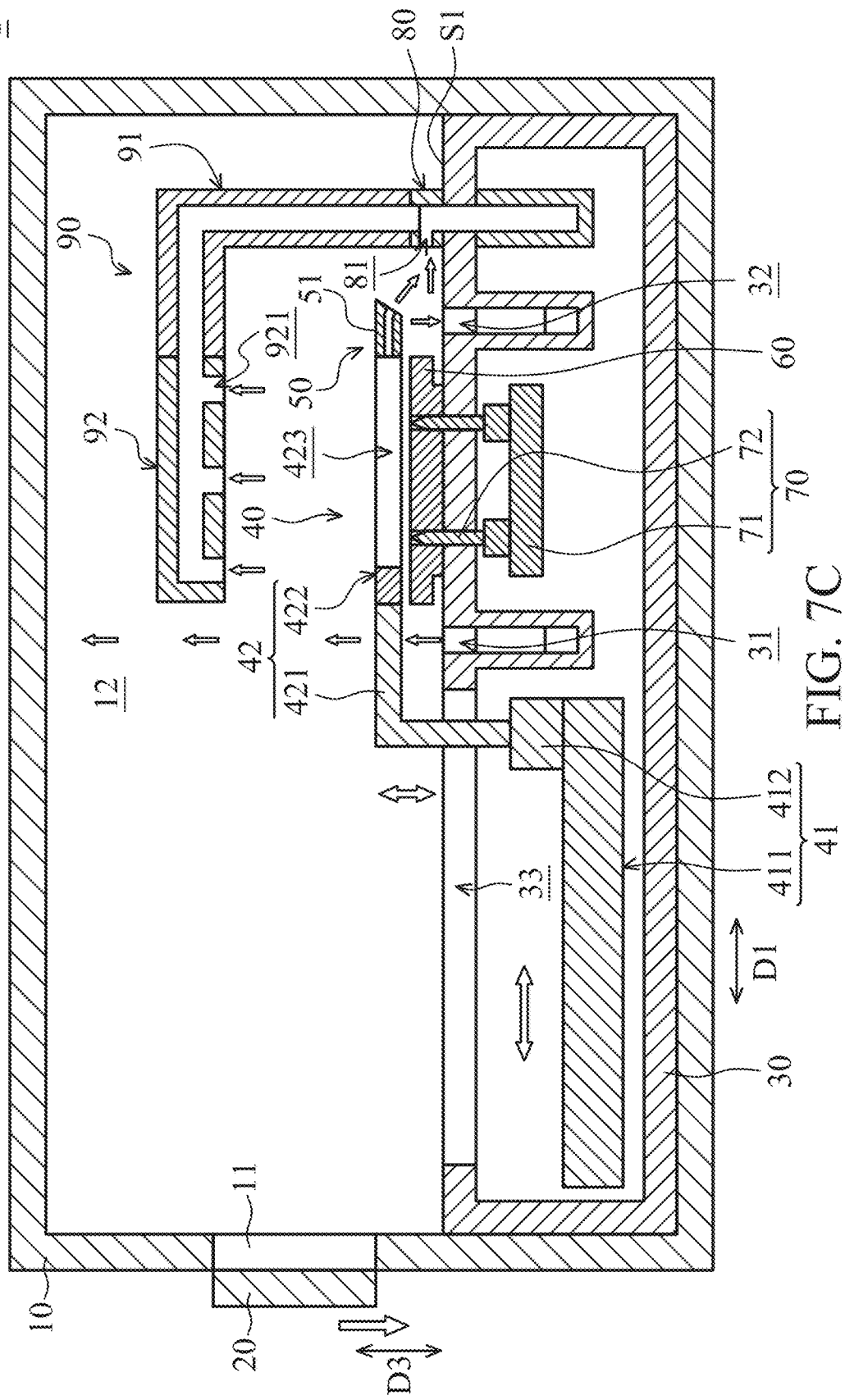

An operation method of cleaning the semiconductor processing apparatus will be described with reference to FIG. 6. and FIGS. 7A to 7C. FIG. 6 is a flow chart of the operation method of cleaning the semiconductor processing apparatus 1 in accordance with some embodiments of the disclosure. FIGS. 7A, 7B and 7C are cross-sectional views of the semiconductor processing apparatus 1 in accordance with some embodiments of the disclosure during a cleaning (or a maintenance) process. When a cleaning process is initiated, a shutter 20 is closed relative to the housing 10 to prevent the particles P1 in the chamber 12 from floating or escaping out of the housing 10 via the door opening 11 (step S101). In some embodiments, there is no wafer W1 in the housing 10 during the cleaning process.

In step S103, gas flows from inlets 31 of the support base 30 to form a gas wall between the shutter 20 and the wafer plate 60. In some embodiments, the gas continuously flows from the inlets 31 during the cleaning process. In some embodiments, the gas pressure of the gas flowing from the inlets 31 is in a range from about 5K pa to about 25K pa. For example, the gas pressure of the gas flowing from the inlets 31 is in a range from about 10K pa to about 20K pa.

The gas in the housing 10 is exhausted from the chamber 12 via the outlets 32 of the support base 30. Further, the gas in the housing 10 is exhausted from the chamber 12 via the exhaust holes 81 and 921 of the air-exhaust device 80 and/or the heating device 90. Therefore, some of the particles P1 on or around the wafer plate 60 are prevented from floating to the shutter 20. Further, due to the gas flowing from the inlets 31 and the closed shutter 20, the particles P1 on or around the wafer plate 60 are prevented from floating out of the housing 10 via the door opening 11.

In some embodiments, the gas flows along the elevating direction D3 from the inlets 31. The gas wall is substantially extended along the elevating direction D3. In some embodiments, the gas includes $N_2$, inert gas or air. In some embodiments, the suction pressure provided by the outlets 32 is in a range from about 40 pa to about 60 pa. For example, the suction pressure provided by the outlets 32 is in a range from about 45 pa to about 55 pa.

In some embodiments, the suction pressure provided by the air-exhaust device 80 is in a range from about 40 pa to about 60 pa. For example, the suction pressure provided by the air-exhaust device 80 is in a range from about 45 pa to about 55 pa. The suction pressure provided by the heating device 90 is in a range from about 40 pa to about 60 pa. For example, the suction pressure provided by the heating device 90 is in a range from about 45 pa to about 55 pa.

In step S105, the nozzle device 50 emits gas toward the support base 30 and the wafer plate 60. In general, some particles P1 are deposited on the wafer plate 60 and the support base 30 after a semiconductor process. The particles P1 deposited on the wafer plate 60 and the support base 30 may contaminate wafers subsequently processed in the processing apparatus. In some embodiments, the gas is $N_2$, inert gas or air.

In some embodiments, the gas pressure of the gas flowed from the nozzle device 50 is in a range from about 3K pa to about 10K pa. For example, the gas pressure of the gas flowed from the nozzle device 50 is in a range from about 3K pa to about 7K pa.

Further, as shown in FIG. 7A to FIG. 7C, the carrying arm 42 is moved toward the wafer plate 60 by the moving mechanism 41 along a moving direction D1. As shown in FIG. 7A, the nozzle device 50 is located adjacent the wafer plate 60. As shown in FIG. 7B, the nozzle device 50 is continually moved to a location over a center of the wafer plate 60. Afterwards, as shown in FIG. 7C, the nozzle device 50 is continually moved to a location over an edge of the wafer plate 60. Therefore, the particles P1 deposited on the upper surface S1 of the support base 30 and the wafer plate 60 are lifted or dislodged from the upper surface S1 of the support base 30 and the wafer plate 60.

At least a portion of the dislodged particles P1 pumped or exhausted out of the chamber 12 through outlets 32 of the support base 30, the exhaust holes 81 of the air-exhaust device 80 and the exhaust holes 921 of the heating device 90.

In the step S107, as shown in FIG. 7C, the carrying arm 42 is located over the wafer plate 60, and is subsequently moved away from the wafer plate 60 to a position as shown in FIG. 3. In some embodiments, the cleaning process terminates when the nozzle device 50 and the outlets 32 stop emitting the gas. The flow via the outlets 32 and the exhaust holes 81 and 921 also terminates.

FIGS. 8A and 8B are cross-sectional views of the semiconductor processing apparatus 1 during a baking process in accordance with some embodiments of the disclosure. As shown in FIG. 8A, a wafer W1 is disposed on the carrying plate 422. Next, the carrying arm 42 is moved to the wafer plate 60 by the moving mechanism 41.

As shown in FIG. 8B, when the carrying plate 422 is located over the wafer plate 60, the pins 72 protrude over the upper surface 62 of the wafer plate 60 by the elevating mechanism 71. The pins 72 further pass through the slots 423 of the carrying plate 422, and come into contact with the wafer W1. Next, the carrying plate 422 is moved down along the elevating direction D3 by the moving mechanism 41, and is moved away from the wafer plate 60 by the moving mechanism 41.

Next, the pin 72 is moved down by the elevating mechanism 71 to lower the wafer W1 onto the wafer plate 60. The wafer plate 60 heats the wafer W1 to a predetermined temperature in a range from about 90° C. to about 250° C. In an embodiment, the predetermined temperature is in a range from about 110° C. to about 150° C. The thermal plate 92 also generates heat which is also transferred to the wafer W1.

Further, the gas is exhausted from the chamber 12 via the exhaust holes 81 and 921 of the air-exhaust device 80 and the heating device 90. Therefore, some of the particles P1 generated during the baking process are exhausted from the chamber 12 by the air-exhaust device 80 and the heating device 90.

In the baking process, the suction pressure provided by the air-exhaust device 80 is in a range from about 10 pa to about 20 pa. The suction pressure provided by the heating device 90 is in a range from about 10 pa to about 20 pa. It should be noticed that, if the suction pressure of the air-exhaust device 80 and the heating device 90 is greater than a predetermined pressure, the heat distribution of the wafer W1 may not be homogeneous.

In some embodiments, the predetermined pressure is in a range from about 40 pa to about 60 pa. In an embodiment, the predetermined pressure is in a range from about 45 pa to about 55 pa. Therefore, the suction pressures of the air-exhaust device 80 and the heating device 90 during the baking process is lower than the suction pressures of the air-exhaust device 80 and the heating device 90 during the cleaning process.

Embodiments of mechanisms for a semiconductor processing apparatus are provided. The semiconductor processing apparatus has a nozzle device disposed on the carrying arm, inlets and outlets. In some embodiments, most of the particles on the support base and the wafer plate are cleaned by the nozzle device. Most of the particles dislodged or freed by the nozzle device are exhausted of the semiconductor processing apparatus by the outlets. Further, the particles raised by the nozzle device are prevented from escaping from the semiconductor processing apparatus by a gas wall formed by the gas emitted by the inlets. Therefore, a cleaning process can be conducted in the semiconductor processing apparatus automatically, and the cleaning time of the semiconductor processing apparatus is reduced. The cleaning process is performed more frequently, and particulate contamination of the wafers during processing is minimized.

In some embodiments, a semiconductor processing apparatus is provided. The semiconductor processing apparatus includes a housing and a support base disposed in the housing. The semiconductor processing apparatus also includes a carrying arm movably disposed on the support base and a nozzle device disposed on the carrying arm. The semiconductor processing apparatus further includes a wafer plate disposed on the support base. During a cleaning process, the carrying arm is moved toward the wafer plate, and the nozzle device emits a first gas toward the support base and the wafer plate.

In some embodiments, a semiconductor processing apparatus is provided. The semiconductor processing apparatus includes a housing, and a support base disposed in the housing and including an upper surface, inlets and outlets located at the upper surface. The semiconductor processing apparatus also includes a carrying arm movably disposed on the support base and a nozzle device disposed on the carrying arm. The semiconductor processing apparatus further includes a wafer plate disposed on the support base. When a cleaning process is performed, the carrying arm is moved toward the wafer plate, and the nozzle device emits a first gas toward the upper surface and the wafer plate. Moreover, when a cleaning process is performed, a second gas is dispensed from the inlets to form a gas wall, and the gas in the housing is exhausted through the outlets.

In some embodiments, a operation method of a semiconductor processing apparatus is provided. The operation method includes providing a carrying arm and a wafer plate on a support base located in a housing. The operation method includes also includes providing a nozzle device disposed on the carrying arm. The operation method further includes emitting a first gas toward the support base and the wafer plate by the nozzle device, and moving the carrying arm toward the wafer plate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor processing apparatus, comprising:
a housing;
a support base disposed in the housing;
a carrying arm movably disposed on the support base and comprising a carrying plate formed with an elongated slot and configured for transporting a wafer;
a nozzle device disposed on the carrying plate; and
a wafer plate disposed on the support base configured for receiving a wafer from the carrying arm,
wherein the carrying arm is movable toward the wafer plate, and the nozzle device is configured to emit a first gas toward the support base and the wafer plate,
wherein the semiconductor processing apparatus further comprises a pin configured to protrude from the support base and extend into the elongated slot of the carrying plate when the carrying arm is moved toward the wafer plate,
wherein the pin is movable along a protruding direction, and the elongated slot extends through the nozzle device along a direction perpendicular to the protruding direction.

2. The semiconductor processing apparatus as claimed in claim 1, wherein the carrying arm is moved along a moving direction, and the nozzle device is substantially extended perpendicular to the moving direction.

3. The semiconductor processing apparatus as claimed in claim 1, wherein the carrying arm is moved along a moving direction, and the nozzle device comprises a plurality of nozzle holes arranged along an extension direction perpendicular to the moving direction.

4. The semiconductor processing apparatus as claimed in claim 1, further comprising a shutter disposed on the housing, wherein when a cleaning process is performed, the shutter is closed relative to the housing.

5. The semiconductor processing apparatus as claimed in claim 1, wherein the support base comprises an inlet located between the carrying arm and the wafer plate, wherein when a cleaning process is performed, a second gas is dispensed form the inlet to form an gas wall.

6. The semiconductor processing apparatus as claimed in claim 5, wherein the support base comprises an outlet opposite to the inlet relative to the wafer plate, wherein when a cleaning process is performed, the gas in the housing is exhausted through the outlet.

7. The semiconductor processing apparatus as claimed in claim 1, wherein the support base comprises an air-exhaust device disposed on the support base and opposite to the carrying arm relative to the wafer plate, wherein when a cleaning process is performed, the gas in the housing is exhaust through the air-exhaust device.

8. The semiconductor processing apparatus as claimed in claim 7, wherein a suction pressure provided by the air-exhaust device is in a range from about 40 pa to about 60 pa.

9. The semiconductor processing apparatus as claimed in claim 7, wherein the carrying arm is movable along a moving direction, and the air-exhaust device comprises a plurality of first exhaust holes arranged along an extension direction perpendicular to the moving direction.

10. The semiconductor processing apparatus as claimed in claim 1, further comprising:
an elevating mechanism disposed in the support base and operable to drive the pin to protrude from the support base.

11. The semiconductor processing apparatus as claimed in claim 1, further comprising a thermal plate located over the wafer plate and having a plurality of second exhaust holes.

12. A semiconductor processing apparatus, comprising:
a housing;
a support base, disposed in the housing, comprising an upper surface, a plurality of inlets and a plurality of outlets located at the upper surface;
a carrying arm, movably disposed on the support base, comprising a carrying plate formed with an elongated slot and configured for transporting a wafer;
a nozzle device disposed on the carrying plate; and
a wafer plate disposed on the support base configured for receiving a wafer from the carrying plate;
wherein the carrying arm is movable toward the wafer plate, and the nozzle device is configured to emit a first gas toward the upper surface and the wafer plate,
wherein the semiconductor processing apparatus further comprises a pin configured to protrude from the support base and extend into the elongated slot of the carrying plate when the carrying arm is moved toward the wafer plate,
wherein the pin is movable along a protruding direction, and the elongated slot extends through the nozzle device along a direction perpendicular to the protruding direction.

13. The semiconductor processing apparatus as claimed in claim 12, wherein the inlets and the outlets are respectively arranged in a U-shape configuration, and the inlets and the outlets are around the wafer plate.

14. The semiconductor processing apparatus as claimed in claim 12, wherein the carrying arm is movable along a moving direction, and the nozzle device is substantially extended perpendicular to the moving direction.

15. The semiconductor processing apparatus as claimed in claim 12, wherein the carrying arm is movable along a moving direction, and the nozzle device comprises a plurality of nozzle holes arranged along an extension direction perpendicular to the moving direction.

16. The semiconductor processing apparatus as claimed in claim 12, further comprising a shutter, disposed on the housing.

17. The semiconductor processing apparatus as claimed in claim 12, wherein the support base comprises an air-exhaust device disposed on the support base and opposite to the carrying arm.

18. The semiconductor processing apparatus as claimed in claim 12, wherein the inlets are located between the carrying arm and the wafer plate, and the outlets are opposite to the inlets relative to the wafer plate.

19. The semiconductor processing apparatus as claimed in claim 12, wherein the inlets have a diameter in a range from about 5 mm to about 20 mm, and the outlets have a diameter in a range from about 5 mm to about 20 mm.

* * * * *